United States Patent [19]

Isobe

[11] Patent Number: 5,801,394

[45] Date of Patent: Sep. 1, 1998

[54] STRUCTURE FOR WIRING RELIABILITY EVALUATION TEST AND SEMICONDUCTOR DEVICE HAVING THE SAME

[75] Inventor: Akira Isobe, Tokyo, Japan

[73] Assignee: NEC Corporation, Tokyo, Japan

[21] Appl. No.: 639,382

[22] Filed: Apr. 26, 1996

Related U.S. Application Data

[63] Continuation of Ser. No. 326,269, Oct. 20, 1994, abandoned.

[30] Foreign Application Priority Data

Nov. 11, 1993 [JP] Japan .................................. 5-305768

[51] Int. Cl.[6] ......................................................... H01L 23/58
[52] U.S. Cl. ........................... 257/48; 257/528; 257/758; 257/773; 257/776; 438/14
[58] Field of Search ........................ 257/48, 66, 760, 257/758, 754, 755, 756, 757, 765, 767, 776, 532, 534, 535, 528, 773; 437/8; 324/158.1

[56] References Cited

U.S. PATENT DOCUMENTS

| | | | |
|---|---|---|---|
| 4,652,812 | 3/1987 | Gimpelson et al. | 257/775 |
| 4,739,258 | 4/1988 | Schwarz | 324/158 R |
| 4,970,574 | 11/1990 | Tsunenari | 257/759 |
| 5,049,811 | 9/1991 | Dreyer et al. | 324/158 R |
| 5,264,377 | 11/1993 | Chesire et al. | 437/8 |
| 5,281,850 | 1/1994 | Kanamori | 257/758 |
| 5,291,142 | 3/1994 | Ohmi | 324/158 R |
| 5,414,351 | 5/1995 | Hsu et al. | 324/158.1 |
| 5,448,179 | 9/1995 | Burns | 257/48 |
| 5,497,076 | 3/1996 | Kuo et al. | 324/158.1 |
| 5,514,974 | 5/1996 | Bouldin | 324/158.1 |

FOREIGN PATENT DOCUMENTS

| | | | |
|---|---|---|---|
| 0265532 | 10/1989 | Japan | 257/48 |
| 4-042554 | 2/1992 | Japan | 257/48 |
| 4-284676 | 10/1992 | Japan | 257/48 |
| 0021161 | 1/1994 | Japan | 257/48 |

OTHER PUBLICATIONS

IBM Technical Disclosure Bulletin (vol. 34, No. 12, May 1992) "On–Chip Electromigration Sensor Using Silicon Device," p. 197.

Liew, B.K., et al., "Reliability Simulator for Interconnect and Intermetallic Contact Elecromigration." Proc. 28th Int. Reliab. Phys. Symp. IEEE, pp. 111–118, 1990.

"Step Spacing Effect on Electromigration", Proc. 1990, IEEE/IRPS, pp. 20–24, 1990. no month.

*Primary Examiner*—David B. Hardy
*Attorney, Agent, or Firm*—Laff, Whitesel, Conte & Saret, Ltd.

[57] ABSTRACT

A test line (12) is formed between a pair of current sypplying terminals (11). A step pattern (14) composed of polysilicon or the like is formed below the test line (12) through an inter-layer insulation film. One of two sides of the step pattern (14) that extends along the longitudinal direction of the test line (12) is positioned therebelow so as to form a step extending in a direction of the test line. Thus, since electromigration tends to easily take place, the deterioration of the semiconductor device can be precisely evaluated.

13 Claims, 5 Drawing Sheets

STRUCTURE FOR WIRING RELIABILITY EVALUATION TEST AND SEMICONDUCTOR DEVICE HAVING THE SAME

This application is a continuation of U.S. patent application Ser. No. 08/326,269, filed Oct. 20, 1994 now abandoned.

FIELD OF THE INVENTION

The present invention relates to a semiconductor device and, in particular, to a semiconductor device having a structure for wiring reliability evaluation test.

BACKGROUND OF THE INVENTION

As the size of wiring lines in the semiconductor device decreases, the density of currents that flow therein increases. Thus, electromigration takes place and is becoming a problem of the reliability of wiring lines. To evaluate withstanding characteristics of the wiring lines against the electromigration, the following test is conventionally performed. As shown in FIG. 1, a wiring pattern with a test line 12 and both a pair of current supplying terminals 11 and a pair of voltage measuring terminals 13 is formed on an insulation film. A cover film (passivation film) having holes for the terminals (pad portions) is formed. Thereafter, pelletizing, bonding, and packaging processes are performed. The resultant semiconductor device is placed in a thermostat. A constant current is supplied to the current supplying terminals 11 and the voltage of the test line is measured at voltage measuring terminals 13. The temperature of the thermostat and the density of current supplied via the current supplying terminals 11 are varied in a predetermined number of levels. For each level, a predetermined number of samples, for example 10 samples, are tested. The time period after each sample is tested until a line breakage takes place, or the line resistance exceeds a predetermined value, is referred to as failure time. Assuming logarithmic normal distribution or Weibull distribution, mean failure time of all the samples is obtained.

Thus, since current acceleration coefficient and activation energy are obtained on the basis of the above result, the life time of the wiring of a semiconductor device at a temperature and a current density at which the semiconductor device is operated can be estimated.

However, it is known that the life time of the wiring is also influenced not only by the structure and film quality of the wiring lines but also by the flatness of an inter-layer insulation film on which the wiring is formed. To solve such a problem, a method where step patterns 14 are formed below a test line 12, as shown in FIG. 2, is known and described in "Step Spacing Effect on Electromigration", Proc. 1990, IEEE/IRPS, pp. 20-24, 1990.

In the semiconductor device that was designed correspondingly to the above-mentioned test, no problem should take place on the electromigration. However, due to a failure in the fabrication stage or the like, the life time of the semiconductor device may be shorter than expected. To detect a failure in the fabrication stage, a structure for wiring reliability evaluation test is formed on a product or on the same wafer thereof. On the wafer, an ultra-high acceleration test is performed so as to verify the wiring. As an evaluation pattern that has been widely used for such a purpose a pattern shown in FIG. 3 is known other than the above-mentioned pattern. Referring to FIG. 3, protrusion portions 22a are formed in a test line 22. The test line 22 is connected between current supplying terminals 21. From the current supplying terminals 21, a current is supplied. The temperature of narrow line portions formed between the protrusion portions 22a is raised by the current. Thus, the test can be performed without need to use an external heat source. When the semiconductor device is tested corresponding to the abovementioned method, if the failure time is shorter than the predetermined value, it is determined that a failure took place in the fabrication process. Thus, the wafer including the failure semiconductor device, or the lot thereof, is treated as a failure wafer, or a failure lot, and prevented from being placed on the market.

With the wiring patterns shown in FIGS. 1 and 3, since the patterns are formed on a flat surface, the patterns do not well simulate the wiring of the real semiconductor devices, which have step patterns formed below the wiring. Thus, with such patterns, the failures of the products cannot be satisfactorily detected. As stated in the above-mentioned document, as long as the step coverage (film thickness of step portion/film thickness of flat portion) is not very low (for example 10%), the failure time of the wiring pattern with the step patterns formed therebelow, as shown in FIG. 2, is not remarkably affected.

Thus, in the conventional wiring reliability evaluation test structure, deterioration and failure time cannot be accurately estimated. Consequently, failure products cannot be prevented from being placed on the market.

SUMMARY OF THE INVENTION

An object of the present invention is to propose a structure for wiring reliability evaluation test that can well simulate a real wiring and to propose a test wiring that tends to more easily cause electromigration than the wiring of a real product, so as to precisely estimate the failure time of the product and to prevent failure products from being placed on the market.

A first aspect of the present invention is a wiring reliability evaluation test structure, comprising a substrate, at least one step pattern formed above the substrate, an interlayer insulation film formed above the substrate in such a manner that the inter-layer insulation film covers the step pattern, and a test line formed above the inter-layer insulation film in such a manner that the test line passes through a region corresponding to the step pattern, wherein the step pattern has an outer peripheral portion that extends in the region corresponding to the test line in a direction that is not perpendicular to a current direction of the test line.

A second aspect of the present invention is a semiconductor substrate on which a functional circuit portion is formed and a wiring reliability evaluation test structure, the structure including at least one step pattern formed above the semiconductor substrate, an inter-layer insulation film formed above the semiconductor substrate in such a manner that the interlayer insulation film covers the step pattern, and a test line formed above the inter-layer insulation film in such a manner that the test line passes through a region corresponding to the step pattern, wherein the step pattern has an outer peripheral portion that extends in the region corresponding to the test line in a direction that is not perpendicular to a current direction of the test line.

In one embodiment of the present invention, at least one step pattern is fully covered by the test line through the inter-layer insulation film.

In one embodiment of the present invention, at least one step pattern is partially covered by the test line through the inter-layer insulation film.

In one embodiment of the present invention, a plane of the step pattern is formed in a parallelogram shape.

In one embodiment of the present invention, a section of the step pattern is formed in a parallelogram shape or a shape having a protrusion portion that protrudes upwardly from the parallelogram.

In one embodiment of the present invention, the step pattern is composed of at least one material taken from a group including polysilicon, polycide, silicide, a metal or an insulator, or is a laminate comprising a plurality of films each composed of at least one material taken from a group including polysilicon, polycide, silicide, a metal or an insulator.

In one embodiment of the present invention, the test line is composed of either aluminum or an alloy thereof, or is a laminate of a first film composed of either aluminum or an alloy thereof and a second film composed of either a high melting point metal or alloy such as W, TiN and TiW.

In one embodiment of the present invention, the test line has a predetermined width and is formed in a straight shape or a zigzag shape.

In one embodiment of the present invention, the test line has a narrow portion and a wide portion, the step pattern being formed at a region corresponding to the narrow portion.

In one embodiment of the present invention, current supplying terminals formed at the ends of the test line are used.

In one embodiment of the present invention, the current supplying terminals are connected to external leads through respective bonding wires.

In one embodiment of the present invention, voltage measuring terminals formed at the ends of the test line are used.

In one embodiment of the present invention, there is used a passivation film formed above the inter-layer insulation film in such a manner that the passivation film covers the test line except for the current supplying terminals.

In one embodiment of the present invention, the semiconductor substrate and the wiring reliability evaluation test structure being covered with a mold resin.

According to the wiring reliability evaluation test structure of the present invention, step patterns are formed below a test line so that the step is formed along the longitudinal direction of the test line, grain boundaries that largely influence the electromigration tend to be formed along the longitudinal direction of the test line. Thus, according to the present invention, the deterioration of the product due to failures of the inter-layer insulation films, the wiring and the passivation film can be more precisely or more strictly evaluated. Consequently, the failure products can be prevented from being placed on the market. In addition, according to the present invention, since the wiring reliability evaluation test structure can be formed in the conventional fabrication process of the product without need to use extra processes, the fabrication cost is not raised.

These and other objects, features and advantages of the present invention will become more apparent in light of the following detailed description of best mode embodiments thereof, as illustrated in the accompanying drawings.

DESCRIPTION OF THE PREFERRED EMBODIMENTS

Next, with reference to the accompanying drawings, embodiments of the present invention will be described.

Figure 4:
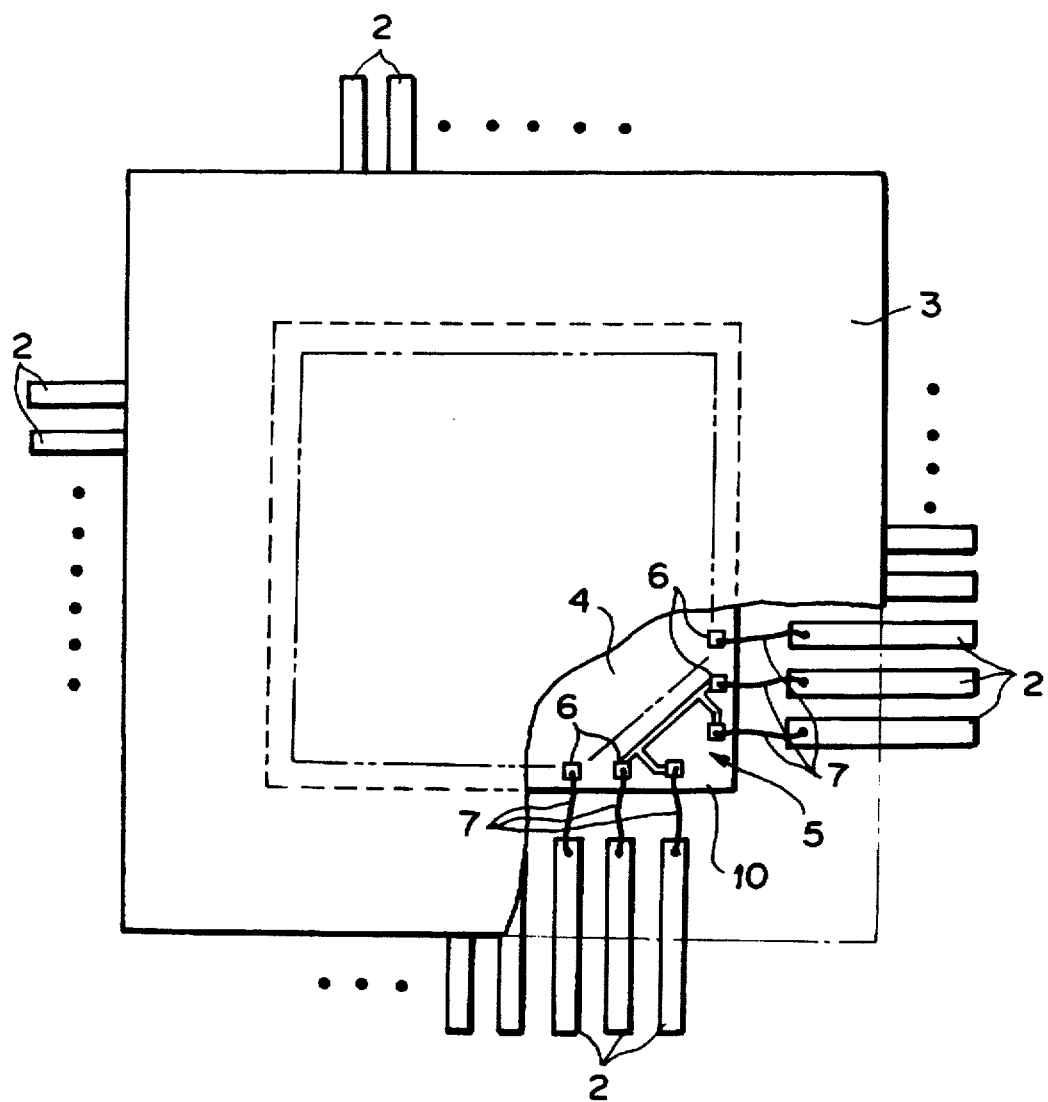
FIG. 4 is a partially cut away, plan view showing a semiconductor device having a wiring reliability evaluation test structure according to the present invention.

FIG. 4 is a partially cut away view showing a semiconductor device having a wiring reliability evaluation test structure according to a first embodiment of the present invention. Referring to FIG. 4, reference numeral 10 denotes a semiconductor substrate composed of silicon or the like. Reference numeral 2 denotes an external lead. Reference numeral 3 denotes a mold resin. On the substrate 10, a functional circuit portion 4 essential to the semiconductor device and a wiring reliability evaluation test structure portion 5 are formed. Reference numeral 6 denotes an electrode pad for electrically connecting both the functional circuit portion 4 and the test structure portion 5 to the outside of the semiconductor device. Reference numeral 7 denotes a bonding wire that electrically connects the electrode pad 6 with the external lead 2.

Figure 5A:
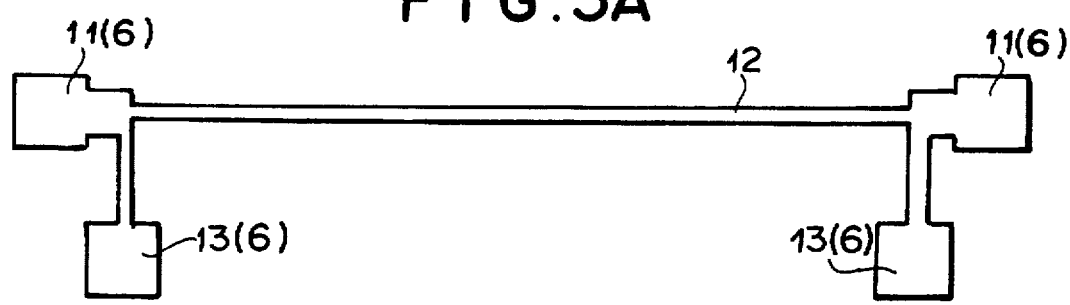
FIG. 5A is a plan view showing a test structure portion of the semiconductor device of FIG. 4.
Figure 5B:
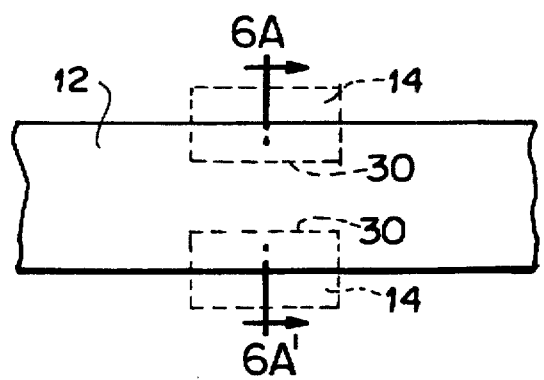
FIG. 5B is a partially enlarged view of FIG. 5A.

FIG. 5A is a plan view showing the test structure portion 5 of the semiconductor device according to the present invention. FIG. 5B is a partially enlarged view of FIG. 5A. Referring to FIG. 5A, a test line 12 is formed between a pair of current supplying terminals 11. Voltage measuring terminals 13 are formed adjacent to the respective current supplying terminals 11. The current supplying terminals 11 and the voltage measuring terminals 13 are equivalent to the electrode pads 6 shown in FIG. 4. The length and width of the line 12 are 500 µm and 2 µm, respectively. In addition, the line 12 is formed straight. The test structure portion 5 is formed along with the functional circuit portion 4 in the fabrication process of the semiconductor device. Thus, the film quality of the wiring, the flatness of the inter-layer insulation film, the film quality of the passivation film, and so forth of the test structure portion 5 are the same as those of the functional circuit portion 4.

Referring to FIG. 5B, step patterns 14 are formed below the test line 12 through an inter-layer insulation film. The step patterns 14 are composed of polysilicon (see FIGS. 6A and 6B). In FIG. 5B, only two step patterns are shown. However, in reality, many step patterns are formed. The plane of the step patterns 14 is a parallelogram shape, preferably, a rectangle shape with outer peripheral portions 30. One of parallel sides of the step pattern 14 that are in parallel with the line 12 is positioned therebelow. Thus, a step that extends in the longitudinal direction of the line 12 is formed below the line 12.

Figure 6A:
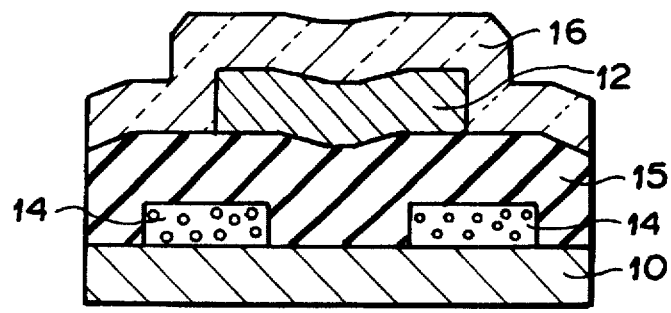
FIG. 6A is a sectional view taken along line A-A' of FIG. 5B.
Figure 6B:
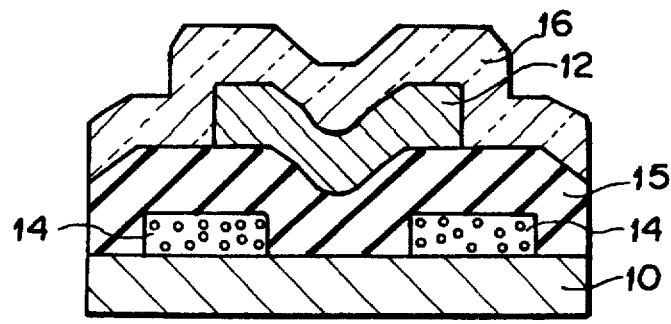
FIG. 6B is another sectional view taken along line A-A' of FIG. 5B.
Figure 7A:
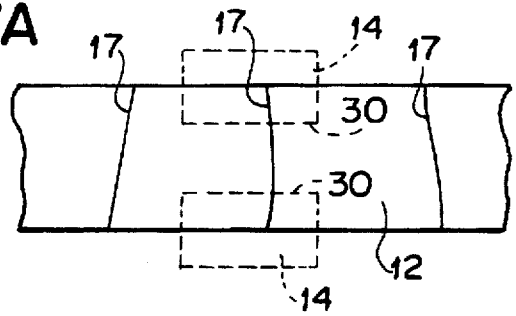
FIG. 7A is a plan view showing a generation of grain boundaries of the semiconductor device according to the present invention.
Figure 7B:
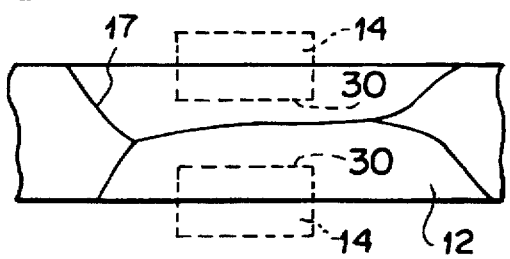
FIG. 7B is a plan view showing another generation of grain boundaries of the semiconductor device according to the present invention.

FIGS. 6A and 6B are sectional views taken along line A-A' of FIG. 5B. FIGS. 7A and 7B are plan views showing generation states of grain boundaries of the test line 12 together with the step patterns 14 having outer peripheral portions 30. In FIGS. 6A and 7A, an inter-layer insulation film that has been normally formed is shown. In FIGS. 6B and 7B, an inter-layer insulation film that has been abnormally formed is shown.

Referring to FIGS. 6A and 6B, the step patterns 14 composed of polysilicon are formed on the semiconductor substrate 10. The inter-layer insulation film 15 is formed above the semiconductor substrate 10 so as to cover the step patterns 14. The test line 12 that is composed of an aluminum alloy is formed above the insulation film 15. In addition, a passivation film 16 is formed above the insulation film 15 so as to cover the test line 12. However, the passivation film 16 is not formed on the terminal portions (electrode pads).

As shown in FIGS. 6A and 7A, when the inter-layer insulation film 15 is smoothly (normally) formed, grain boundaries 17 are formed perpendicular to the longitudinal direction of the test line 12. In contrast, as shown in Figs. GB and 7B, when the inter-layer insulation film 15 is not smoothly formed, the grain boundaries 17 tends to be formed in the direction of the test line parallel with the step. When the grain boundaries 17 are formed along the longitudinal direction of the test line 12, aluminum atoms tend to travel due to occurrence of electromigration, thereby decreasing the failure time.

Since the wiring reliability evaluation test means shown in the drawings is formed in the fabrication process of the real product, if films of the real product are abnormally formed, the inter-layer insulation film and the test line of the wiring reliability evaluation test means are influenced. Thus, after the wafer process is completed or the product fabrication is completed, the resultant sample is positioned on a heating stage of 200° C., then a current is supplied to the current supplying terminals 11 in such a manner that the current density becomes $1 \times 10^7$ A/cm$^2$. At this point, by measuring the electromigration failure time, the life time of the product can be precisely expected.

Figure 1:
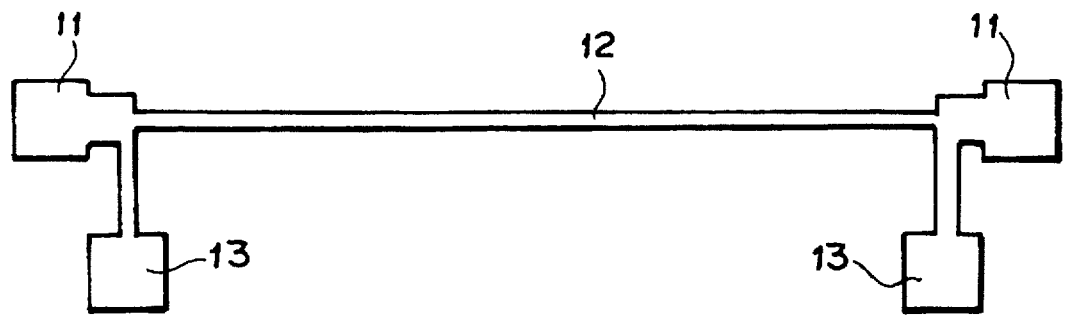
FIG. 1 is a plan view showing a conventional test wiring.
Figure 2:
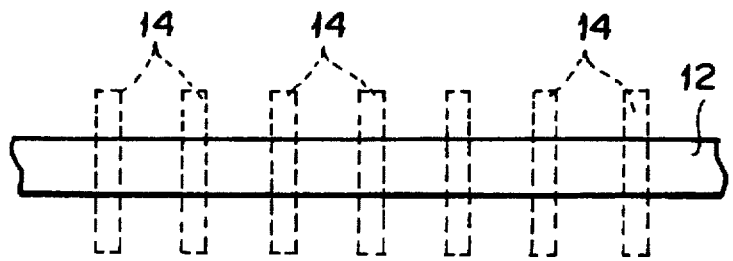
FIG. 2 is a plan view showing a conventional wiring reliability evaluation test structure.

On the other hand, the reason why the failure time of a real wiring cannot be simulated with the test line 12 shown in FIG. 2 would be as follows. Since the test line 12 intersects with the step patterns 14 that are formed perpendicular to the longitudinal direction of the line 12, the grain boundaries of the test line (Al) 12 are formed perpendicular to the longitudinal direction thereof. The electromigration of the test line 12 takes place due to the traveling of aluminum atoms in the current direction, the aluminum atoms tend to travel along the grain boundaries of the test line 12. Thus, in the conventional test wiring, where the grain boundaries are not formed in the current direction, the progress of the electromigration is suppressed. However, in a real wiring, step patterns 14 may extend in the longitudinal direction of a wiring line. In this case, the grain boundaries of the line tend to be formed in the longitudinal direction thereof (namely, the current direction). Thus, the progress of the electromigration of the wiring of the functional circuit portion may be faster than that of the test wiring.

Figure 8A:
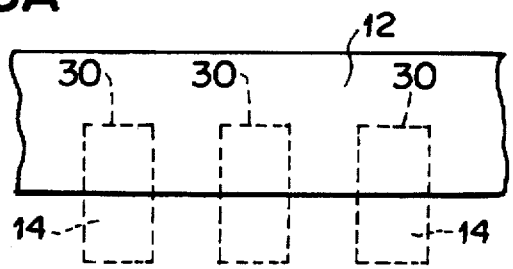
FIG. 8A is a plan view showing a modification of the semiconductor device according to the present invention.
Figure 8B:
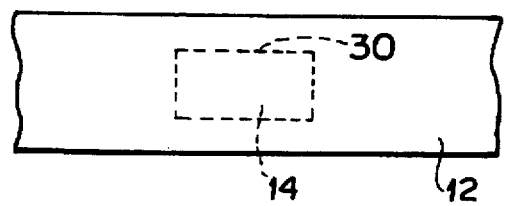
FIG. 8B is a plan view showing another modification of the semiconductor device according to the present invention.
Figure 8C:
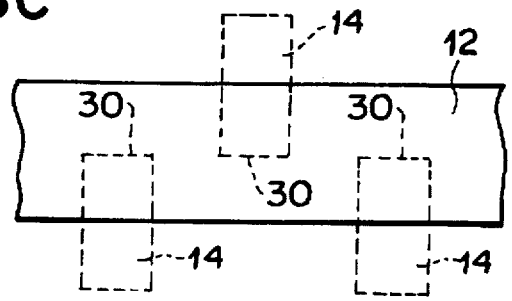
FIG. 8C is a plan view showing a further modification of the semiconductor device according to the present invention.

FIGS. 8A, 8B and 8C are schematic diagrams showing modifications of the first embodiment of the present invention. FIGS. 8A, 8B and 8C correspond to FIG. 5B. Referring to FIG. 8A, a test line 12 is formed above a sequence of step patterns 14 having outer peripheral portion 30, so that the test line 12 passes through one side of each step pattern 14, the side being parallel to the test line 12. Referring to FIG. 8B, a test line 12 is formed so that it fully covers a step pattern 14. Referring to FIG. 8C, a test line 12 is formed above a sequence of step patterns 14 that are formed in a zigzag shape so that the test line 12 passes through the center line of the zigzag shape of sequence. In each of the modifications, the step patterns 14 have an outer peripheral portion that extends along the test line 12.

The selection of these step patterns, the length and width of the test line, and the number of step patterns formed below the test line depends on the wiring construction of the real product to be evaluated.

Figure 3:
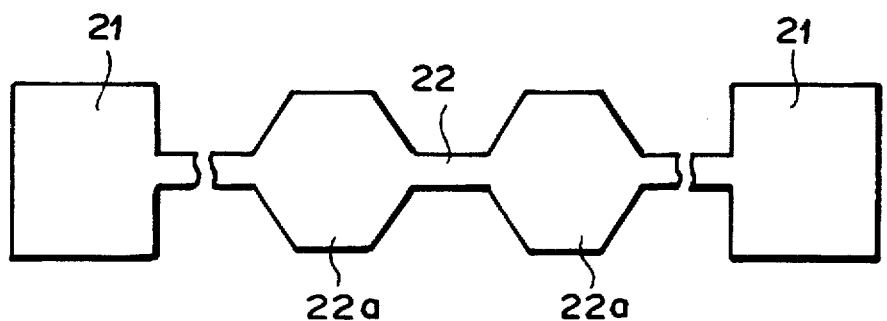
FIG. 3 is a plan view showing a conventional test wiring.
Figure 9:
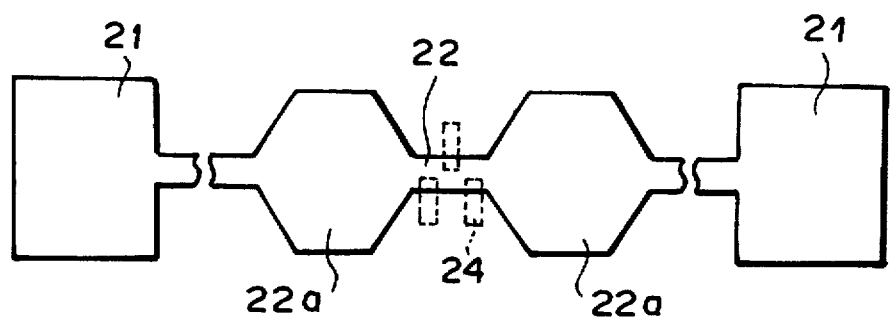
FIG. 9 is a plan view showing another test structure portion of the semiconductor device according to the present invention.

FIG. 9 is a plan view showing a test structure portion of a semiconductor device according to a second embodiment of the present invention. In the second embodiment, a pattern similar to that shown in FIG. 3 is used. Referring to FIG. 9, a test line 22 is formed between a pair of current supplying terminals 21. The test line 22 has a plurality of protrusion portions 22a that are cyclically formed. In addition, as with the first embodiment, step patterns 24 are formed below a narrow line portion that is positioned between the protrusion portions 22a. The structure of the other portions of the second embodiment is the same as that of the first embodiment.

In the second embodiment, a wiring reliability evaluation test is performed by measuring the failure time, which is a time period after a current is supplied until the test line is broken.

Figure 10:
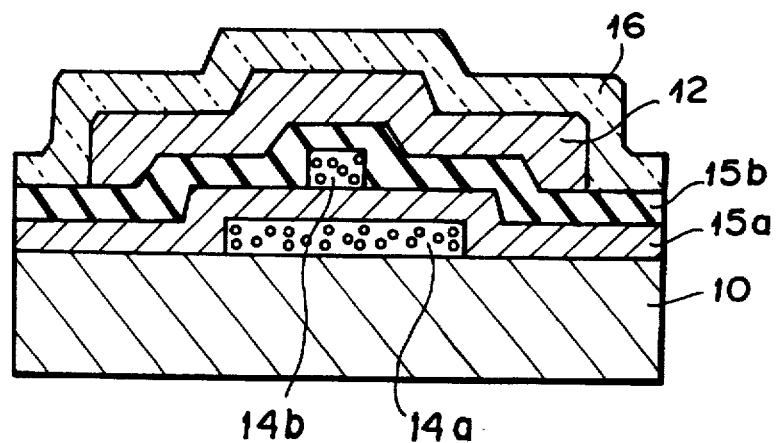
FIG. 10 is a sectional view showing a test structure according to the present invention.

FIG. 10 is a sectional view showing another test structure portion of a semiconductor device according to the present invention. Referring to FIG. 10, a first polysilicon film 14a, a first inter-layer insulation film 15a, a second polysilicon film 14b and a second inter-layer insulation film 15b are formed above a substrate 10. Reference numeral 12 denotes a test line. Reference numeral 16 denotes a passivation film. In this embodiment, the first polysilicon film 14a, the first inter-layer insulation film 15a and the second polysilicon film 14b constructs a step pattern. The step pattern has a protrusion portion that protrudes upwardly from a rectangle portion.

According to the above-described embodiments, since the semiconductor device has a wiring reliability evaluation test structure, even if all the processes including the packaging process are completed, the final product can be evaluated. In addition, after the wafer process is completed, the wafer can be evaluated so as to detect a failure product.

According to the present invention, both the above-mentioned wiring reliability evaluation test structure formed in a semiconductor device and a wiring reliability evaluation test structure that is not formed in a semiconductor device are provided. The former was shown in the above-described embodiments. The latter is, for example, a structure that is formed at a first portion of the wafer where the semiconductor device having a functional circuit portion is formed at the second portion other than the first portion. Thus, after the wafer process is completed, the life time of the semiconductor device that is manufactured by using the same wafer can be precisely predicted.

The preferred embodiments of the present invention were described. However, the present invention is not limited to such embodiments. In the above-described embodiments, the polysilicon film was used to form the step patterns. However, polycide or silicide may be used instead of polysilicon. In addition, with a first-layered metal line of a multi-layer wiring that is used as step patterns, a second-layered line may be tested. Moreover, as described above, step patterns that are composed of a composite film of such films may be used. The test line (wiring pattern) may be formed in a zigzag shape instead of straight shape. The test line may be composed of aluminum or an alloy thereof, or may be a laminate of a first film composed of aluminum or an alloy thereof and a second film composed of a high melting point metal or alloy such as W, TiN and TiW.

Although the present invention has been shown and described with respect to best mode embodiments thereof, it should be understood by those skilled in the art that the foregoing and various other changes, omissions and additions in the form and detail thereof may be made therein without departing from the spirit and scope of the present invention.

What is claimed is:

1. A semiconductor device comprising a semiconductor substrate having a major surface on which a functional circuit portion is formed and a wiring reliability evaluation test structure, said structure including:

at least one step pattern formed on said major surface of said semiconductor substrate;

an inter-layer insulation film formed on said major surface of said semicondutor substrate in such manner that said inter-layer insulation film covers said step pattern; and a test line formed on said inter-layer insulation film in such a manner that said test line passes through a region corresponding to said step pattern as viewed in a direction perpendicular to said major surface.

said step pattern being an outer peripheral portion that extends, as viewed in a direction perpendicular to said major surface, in the region corresponding to said test line, said outer peripheral portion extending in a direction that is not perpendicular to a current direction of said test line, in a region corresponding to said test line, current supplying terminals formed at ends of said test line, said current supplying terminals being connected to external leads through respective bonding wires.

2. The structure as set north in claim 1, wherein said at least one step pattern is fully covered by said test line.

3. The structure as set forth in claim 1, wherein the at least one step pattern is partially covered by said test line.

4. The structure as set forth in claim 1, wherein a plane of said at least one step pattern is formed in a parallelogram shape.

5. The structure as set forth in claim 1, wherein a section of said at least one step pattern is formed in a parallelogram shape having a protrusion portion that protrudes from the parallelogram in a upward direction relative to said major surface of said substrate.

6. The structure as set forth in claim 1, wherein said step pattern is composed of a material taken from a group consisting of polysilicon, polycide, silicide, a metal, an insulator, a laminate comprising a plurality of films each composed of a material taken from a group consisting of polysilicon, polycide, silicide, a metal, and an insulator.

7. The structure as set forth in claim 1, wherein said test line is composed of a material taken from a group consisting of aluminum, an alloy thereof, and a laminate of a first film composed of a material taken from a group consisting of aluminum and an alloy thereof and a second film composed of a material taken from a group consisting of a high melting point metal and alloy such as W, TiN and TiW.

8. The structure as set forth in claim 1, wherein said test line has a predetermined width and is formed in a pattern taken from a group consisting of a straight shape and a zigzag shape.

9. The structure as set forth in claim 1, wherein said test line has a narrow portion and a wide portion, said at least one step pattern being formed at a region corresponding to the narrow portion.

10. The structure as set forth in claim 1, further comprising current supplying terminals formed at ends of said test line.

11. The structure as set forth in claim 10, further comprising voltage measuring terminals formed at ends of said test line.

12. A semiconductor device comprising a semiconductor substrate having a major surface on which a functional circuit portion is formed and a wiring reliability evaluation test structure, said structure including:

at least one step pattern formed on said major surface of said semiconductor substrate;

an inter-layer insulation film formed on said major surface of said semiconductor substrate in such a manner that said inter-layer insulation film covers said step pattern; and a test line formed on said inter-layer insulation film in such a manner that said test line passes through a region corresponding to said step pattern, current supplying terminals formed at ends of said test line, said test line being electrically isolated from said step pattern by said inter-layer insulation film, a passivation film formed on said inter-layer insulation film in such a manner that said passivation film covers said test line except for said current supplying terminals, said step pattern having an outer peripheral portion that extends into a region corresponding to said test line, said outer peripheral portion extending in a direction that is not perpendicular to a direction of current in said test line, in the region where said test line passes said step pattern, and said test line and at least a portion of said step pattern being overlapped via said inter-layer insulation film so that said outer peripheral portion of said step pattern extends under said test line in a direction parallel to a direction of said test line.

13. A semiconductor device comprising a semiconductor substrate having a major surface on which a functional circuit portion is formed and a wiring reliability evaluation test structure, said structure including:

at least one step pattern formed on said major surface of said semiconductor substrate;

an inter-layer insulation film formed on said major surface of said semiconductor substrate in such a manner that said inter-layer insulation film covers said step pattern; and a test line formed on said inter-layer insulation film in such a manner that said test line passes through a region corresponding to said step pattern, current supplying terminals formed at ends of said test line, said test line being electrically isolated from said step pattern by said inter-layer insulation film, a passivation film formed on said inter-layer insulation film in such a manner that said passivation film covers said test line except for said current supplying terminals, said semiconductor substrate and the wiring reliability evaluation test structure being covered with a molded resin material, said step pattern having an outer peripheral portion that extends into a region corresponding to said test line, said outer peripheral portion extending in a direction that is not perpendicular to a direction of current in said test line, in the region where said test line passes said step pattern, and said test line and at least a portion of said step pattern being overlapped via said inter-layer insulation film so that said outer peripheral portion of said step pattern extends under said test line in a direction parallel to a direction of said test line.

* * * * *